United States Patent
Kang et al.

(10) Patent No.: US 8,113,902 B2
(45) Date of Patent: Feb. 14, 2012

(54) FLAT DISPLAY PANEL SEALING APPARATUS AND METHOD OF THE SAME

(75) Inventors: Tae-Wook Kang, Yongin (KR); Min-Sang Koo, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 181 days.

(21) Appl. No.: 12/607,913

(22) Filed: Oct. 28, 2009

(65) Prior Publication Data

US 2010/0105277 A1    Apr. 29, 2010

(30) Foreign Application Priority Data

Oct. 28, 2008    (KR) .................. 10-2008-0105860

(51) Int. Cl.
*H01J 1/62* (2006.01)
*H01J 63/04* (2006.01)
*H01J 9/00* (2006.01)
*H05B 33/10* (2006.01)

(52) U.S. Cl. ............... 445/25; 445/60; 445/66; 445/24; 445/1; 313/483

(58) Field of Classification Search ............... None
See application file for complete search history.

(56) References Cited

U.S. PATENT DOCUMENTS

| 7,488,388 B2 * | 2/2009 | Ryu et al. ............... 118/664 |
| 2011/0045732 A1 * | 2/2011 | Suzuki et al. ............... 445/25 |

FOREIGN PATENT DOCUMENTS

| KR | 10-2001-011121 A | 12/2001 |
| KR | 10-2005-0058047 A | 6/2005 |
| KR | 10-0808135 B1 | 2/2008 |
| KR | 10-2009-0043236 A | 5/2009 |

OTHER PUBLICATIONS

Notice of Allowance dated May 31, 2010 received in priority application, KR Patent Application No. 10-2008-0105860.

* cited by examiner

*Primary Examiner* — Natalie K Walford
(74) *Attorney, Agent, or Firm* — Knobbe Martens Olson & Bear LLP

(57) ABSTRACT

A flat display panel sealing device that can prevent separation of a sealant by applying pressure to a first substrate and a second substrate with the sealant therebetween is disclosed. While the pressure is applied, light is irradiated to the sealant, whereby the first and second substrates are sealed together.

16 Claims, 4 Drawing Sheets

FLAT DISPLAY PANEL SEALING APPARATUS AND METHOD OF THE SAME

CROSS-REFERENCE TO RELATED APPLICATION

This application claims priority to and the benefit of Korean Patent Application No. 10-2008-0105860 filed in the Korean Intellectual Property Office on Oct. 28, 2008, the entire contents of which are incorporated herein by reference.

BACKGROUND

1. Field

The field relates to a flat panel display panel sealing device and a method of using the device. More particularly, the field relates to a flat display panel sealing device that seals a rear substrate and a front substrate that receives radiated light at a cell sealant between the rear and front substrates while the two substrates are pressed together.

2. Description of the Related Technology

A flat panel display panel includes, for example, a liquid crystal display (LCD), a plasma display panel (PDP), and an organic light emitting diode (OLED) display. For convenience, the OLED display will be described.

The OLED display includes a plurality of organic light emitting diodes (OLEDs) each of which includes a hole injection electrode, an organic emission layer, and an electron injection electrode, and light is emitted by energy that is generated when an exciton that is generated by coupling of electrons and holes falls from an excited state to a ground state within the organic emission layer.

The OLED display arranges subpixels in a matrix format in a display area, and the subpixel includes an OLED and a driving circuit unit. The driving circuit unit includes a switching transistor, a driving transistor, and a storage capacitor.

The OLED display is formed by forming subpixels at a rear substrate and sealing the sear substrate to a front substrate. A sealing method of the OLED display includes a laser sealing method.

For example, according to the laser sealing method, a glass frit is arranged between the rear substrate and the front substrate at an edge of the display area, and the rear substrate and the front substrate are sealed by heating the glass frit with a laser beam.

The laser sealing method using the glass frit may generate a sealing failure if the rear substrate and the front substrate are not tightly attached to the glass frit.

In some embodiments, the OLED display may be individually manufactured, or, alternatively a plurality of OLED displays may be manufactured together for productivity improvement.

In a substrate array, the rear substrate and the front substrates are bonded to each other by an edge sealant provided at an edge between the two substrates. The plurality of unit cells are isolated by the edge sealants around each unit cell.

The laser sealing method can be further applied to seal the rear substrate and the front substrate by heating the cell sealant of the substrate array that is bonded by the edge sealant.

For example, according to a vacuum method, the rear substrate and the front substrate are bonded under vacuum, the vacuum condition is changed to an atmosphere condition and the cell sealant is attached to the front substrate by using an internal and external pressure difference of the rear and front substrates, and the two substrates are sealed by heating the cell sealant with a laser beam.

When the vacuum is insufficient, that is, when internal pressure is not low enough compared to external pressure, the rear substrate and the front substrate are not securely attached. As a result the substrates can separate.

Once the rear substrate and the front substrate are bonded, a cavity may be formed in one substrate in order to ease the increase of the internal pressure with an increase of internal volume. In this case, the cell sealant may be separated due to the internal volume of the substrates, alignment of the cell sealant, and location of an edge sealant.

The above information disclosed in this Background section is only for enhancement of understanding of the background of the invention and therefore it may contain information that does not form the prior art that is already known in this country to a person of ordinary skill in the art.

SUMMARY OF CERTAIN INVENTIVE ASPECTS

One aspect is a flat display panel sealing device including a stage configured to support a first substrate and a second substrate that are to be bonded together by a sealant between the first and second substrates, a mask facing the stage and configured to transmit radiated light to the sealant, and a chamber between the mask and the stage, where the chamber is configured to receive a pressure fluid to apply pressure to the first and second substrates.

Another aspect is a flat display panel sealing method including providing first and second substrates having a sealant therebetween to a chamber formed between a stage and a mask, applying pressure to the first substrate and the second substrate in the chamber, and sealing the first and second substrates by radiating light through the mask to the sealant while applying the pressure.

DETAILED DESCRIPTION OF CERTAIN INVENTIVE EMBODIMENTS

Figure 1:
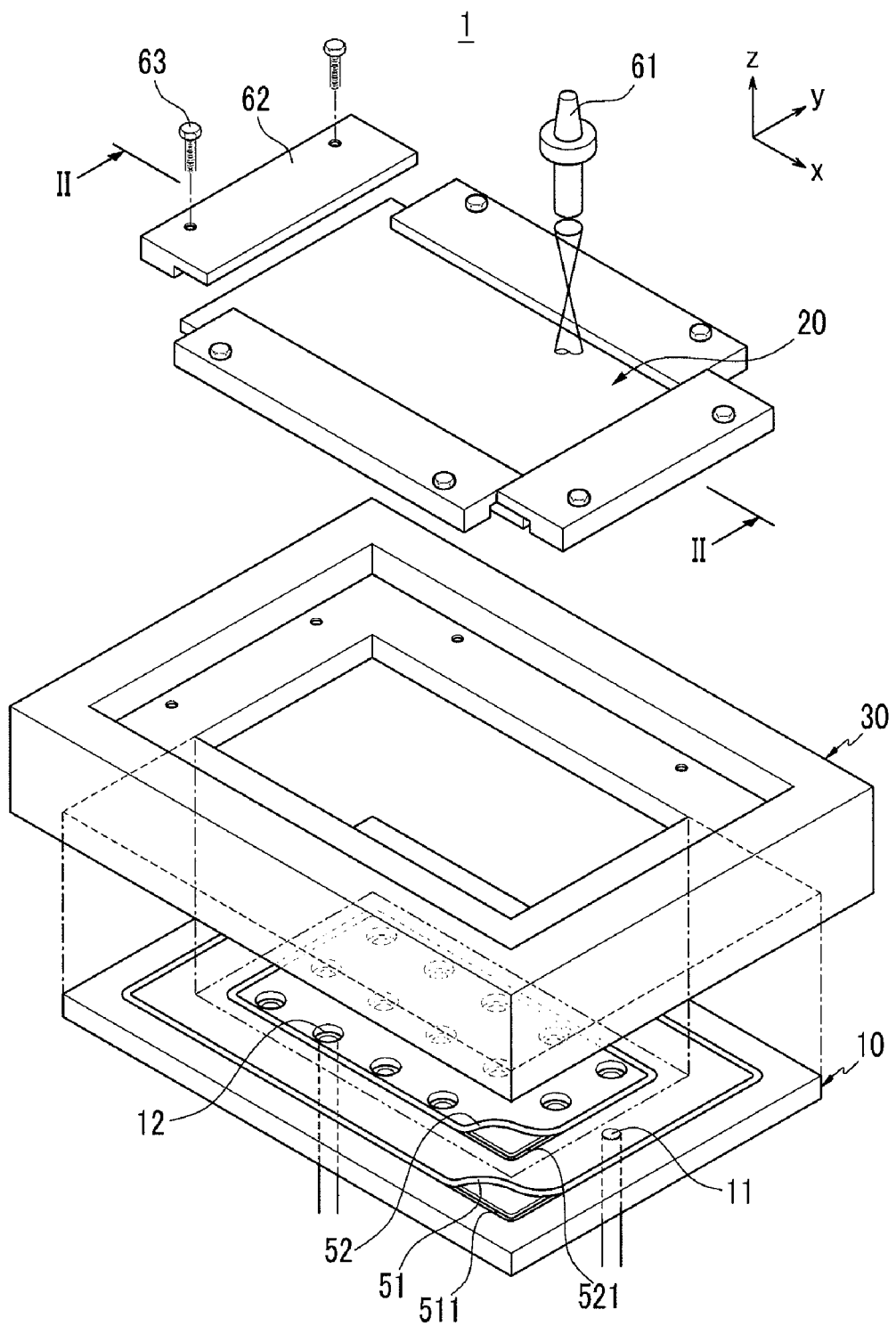
FIG. 1 is an exploded perspective view of a flat display panel sealing device according to an exemplary embodiment.

An exemplary embodiment is related to a flat display panel sealing device that can prevent separation of a cell sealant by airtightly sealing a first substrate and a second substrate with a cell sealant, and a method thereof.

An exemplary embodiment relates to a flat display panel sealing device that can seal a first substrate and a second substrate when internal pressure of the first and second substrates is higher than or the same as external pressure, and a method thereof.

An exemplary embodiment relates to a flat display panel sealing device having the capability of forcing pressure when differential pressure is insufficient to thereby reduce manufacturing cost by not forming a cavity in one substrate, and a method thereof.

In addition, a flat panel display panel sealing device according to an exemplary embodiment can reduce differential pressure with forced pressure, and prevent generation of an interference pattern, that is, a Newton ring that is generated when a center portion of a cell is concavely sunken due to excessive differential pressure, and a method thereof.

A flat display panel sealing device according to an exemplary embodiment includes a stage that interposes a cell sealant that sets a flat display panel of a unit cell and supports a first substrate and a second substrate to be bonded while facing each other by an edge sealant interposed at an edge of the unit cells, a mask disposed facing the stage and transmitting radiated light into the cell sealant, and a chamber that receives and presses the first and second substrates.

The flat display panel sealing device according to an exemplary embodiment may include a pressure hole that supplies pressure fluid into the chamber. The pressure hole may be formed in at least one side of the stage outside a facing area that faces the first and second substrates and the chamber. The chamber may be disposed between the mask and the stage.

The stage may elastically adsorb an edge of the pressure hole to the chamber from outside of the facing area of the first and second substrates and has a first O-ring groove in which a first O-ring that seals the chamber and the stage is disposed.

The flat display panel sealing device may include a first control valve that is connected to the pressure hole and controls supply of the pressure fluid.

The stage may have a negative pressure hole that forms negative pressure in the first substrate within the facing area of the first and second substrates. One or more negative pressure holes may be formed in the facing area. The plurality of negative pressure holes may be disposed in a lattice format in the facing area.

The stage may elastically adsorb an edge of the negative pressure holes in the facing area, and has a second O-ring groove in which a second O-ring that seals the first substrate and the stage is disposed.

The flat display panel sealing device may include a second control valve that is connected to the negative pressure hole and controls the negative pressure.

The mask may be fixed to the chamber by a holder outside a facing area of the first substrate and the second substrate, and have a third O-ring groove in which a third O-ring that seals the chamber and the mask is disposed in a facing area of the mask and the chamber.

The mask may expose the cell sealant to the light, and may further include a reflection film that is formed corresponding to an area other than the cell sealant location.

The flat display panel may include an organic light emitting diode (OLED) display. The cell sealant may be formed of a glass fit. The light may be formed by a laser beam.

A flat display panel sealing method according to another exemplary embodiment includes providing a mask to face a stage in a chamber, providing a cell sealant that sets a flat display panel of a unit cell, and loading a first substrate and a second substrate that are to be bonded while facing each other by an edge sealant provided in an edge of the unit cells, pressing the first and second substrates in the chamber, and sealing by radiating light to the mask and heating the cell sealant with light having passed through the mask.

The pressing may further include suctioning the first substrate to the stage by forming negative pressure. The pressing may include moving the first substrate and the second substrate into the chamber, aligning the moved first and second substrates and the mask, and pressing the aligned first and second substrates. The pressing may include supplying compressed air or nitrogen to the chamber as a pressure fluid.

According to the exemplary embodiment, the first and second substrates are sealed by heating the cell sealant interposed therebetween with light transmitted through the mask while receiving and pressing the first and second substrates in the chamber, and therefore the two substrates can be airtightly sealed by airtightly attaching the first and second substrates to the cell sealant. Accordingly, separation of the cell sealant can be prevented.

According to an exemplary embodiment, the two substrates can be sealed even when internal pressure of the two substrates is higher than or the same as external pressure.

In addition, according to an exemplary embodiment, the substrate manufacturing cost can be reduced by eliminating a cavity in one of the substrates, and generation of an interference pattern, that is, a Newton ring, on the substrate can be prevented.

Certain embodiments will be described more fully hereinafter with reference to the accompanying drawings, in which exemplary embodiments of the invention are shown. As those skilled in the art would realize, the described embodiments may be modified in various ways, without departing from the spirit or scope of the present invention. The drawings and description are to be regarded as illustrative in nature and not restrictive. Like reference numerals generally designate like elements throughout the specification.

Figure 2:
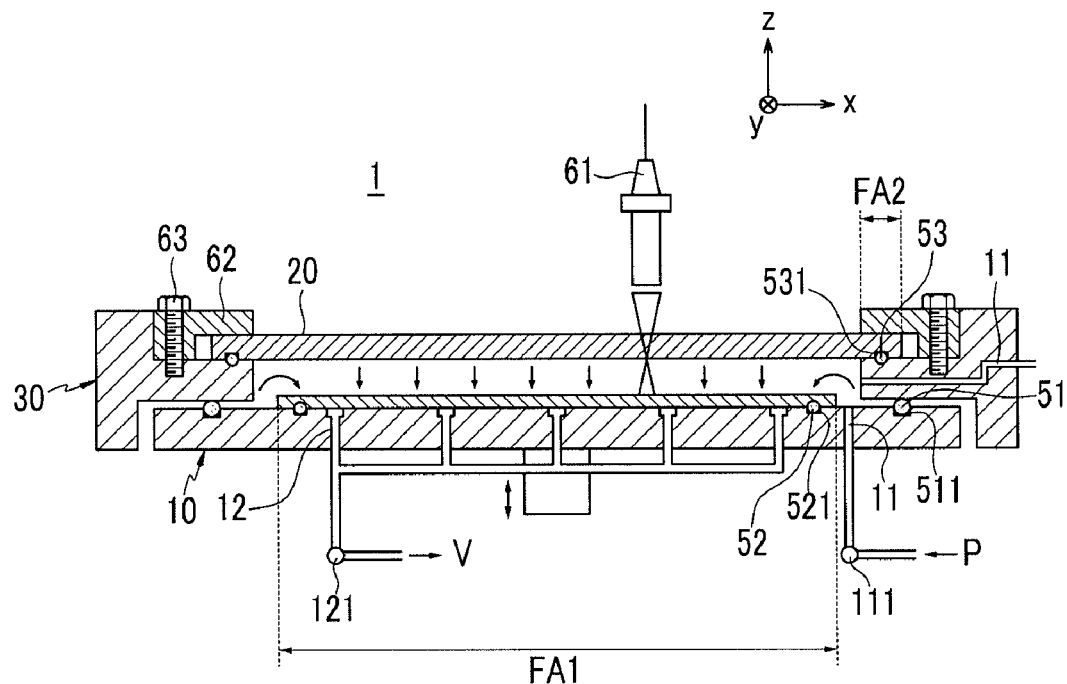
FIG. 2 is a cross-sectional view of FIG. 1, taken along the line II-II.

FIG. 1 is an exploded perspective view of a flat display panel sealing device according to an exemplary embodiment, and FIG. 2 is a cross-sectional view of FIG. 1, taken along the line II-II. Referring to FIG. 1 and FIG. 2, a flat display panel sealing device 1 includes a stage 10, a mask 20, and a chamber 30.

Figure 4:
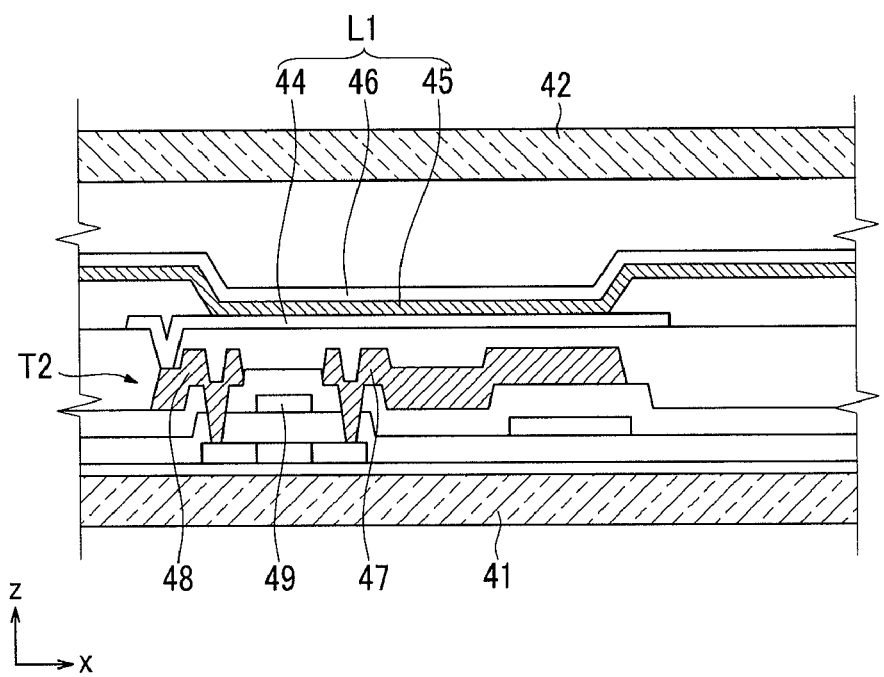
FIG. 4 is a cross-sectional view of a flat display panel.

The stage 10 is formed to support a first substrate (for example, a front substrate) 42 and a second substrate (for example, a rear substrate) 41 of a flat display panel (see FIG. 4). The stage 10 supports the rear substrate 41, which supports the front substrate 42. A cell sealant 43 is provided between the rear substrate 41 and the front substrate 42 (see FIG. 5).

When the rear and front substrates 41 and 42 are provided to the flat display panel sealing device 1 of the present exemplary embodiment, the rear and front substrates 41 and 42 have a substrate array with a plurality of flat display panels of unit cells. In the substrate array, the cell sealant 43 sets a unit cell and an edge sealant 431 bonds the rear substrate 41 and the front substrate 42 at the outermost edge of the unit cells.

The flat display panel of the present exemplary embodiment may be, for example, an plasma display panel (PDP), a liquid crystal display (LCD) or an OLED display.

For example, the cell sealant 43 may be formed as a glass fit, and an edge sealant 431 may be formed as a thermosetting or UV-curable epoxy sealant.

When the flat display panel is an OLED display, penetration of oxygen or moisture into the rear and front substrate 41 and 42 should be prevented. For this purpose, the substrates 41 and 42 are bonded by the edge sealant 431 first, and then the substrates 41 and 42 are sealed by heating the cell sealant 43.

In addition, when the flat display panel is an LCD or a plasma display panel (PDP), the substrates are bonded by applying the edge sealant to the edges of the substrates before pressing the substrates.

In some embodiments, the flat display panel, is formed by sealing the rear substrate 41 and the front substrate 42 facing each other with the cell sealant 43. In display areas of the rear substrate 41 and the front substrate 42 facing each other, subpixels are disposed in a matrix format.

Figure 3:
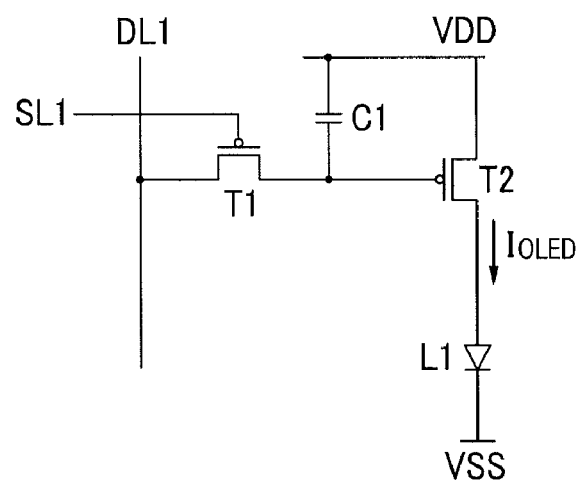
FIG. 3 is a schematic diagram of a subpixel circuit structure of a flat display panel.

FIG. 3 is a schematic diagram of an embodiment of a subpixel circuit structure of the flat panel display of FIG. 1, and FIG. 4 is a cross-sectional view of the subpixel circuit structure of FIG. 4. Other subpixel circuit structures can also be used.

Referring to FIG. 3 and FIG. 4, a subpixel in the flat display panel includes an OLED L1 and a driving circuit unit. The OLED L1 includes an anode 44, an organic emission layer 45, and a cathode 46.

The driving circuit unit includes two thin film transistors and a one storage capacitor C1. The thin film transistors include a switching transistor T1 and a driving transistor T2.

The switching transistor T1 is connected to a scan line SL1 and a data line DL1, and transmits a data voltage input from the data line DL1 to the driving transistor T2 according to a switching voltage input to the scan line SL1.

The storage capacitor C1 is connected to the switching transistor T1 and a power source line VDD, and stores a voltage that corresponds to a voltage difference between a voltage from the switching transistor T1 and a voltage from the power source line VDD.

The driving transistor T2 is connected to the power source line VDD and the storage capacitor C1, and supplies an output current $I_{OLED}$ that is approximately proportional to the square of the difference between the voltage stored in the storage capacitor C1 and a threshold voltage to the OLED L1. The OLED L1 emits light according to the output current $I_{OLED}$.

The driving transistor T2 includes a source electrode 47, a drain electrode 48, and a gate electrode 49, and the anode 44 of the OLED L1 may be connected to the drain electrode 48 of the driving transistor T2. The configuration of the subpixel is not limited, and may be variously modified.

The front substrate 42 is sealed to the rear substrate 41 with a gap therebetween by the cell sealant 43, and protects driving circuit units and OLEDs formed in the rear substrate 41 from the external environment.

The stage 10 supports the rear substrate 41 and the front substrate 42 that are bonded by the edge sealant 431 for sealing unit cells in the rear substrate 41 and the front substrate 42 that are in the substrate array.

Referring back to FIG. 1 and FIG. 2, the stage 10 has a pressure hole 11 for supplying pressure fluid so as to press the rear substrate 41 and the front substrate 42 that have the cell sealant 43 interposed therebetween.

For example, the pressure hole 11 can be formed outside of a facing area FA1 that faces the rear substrate 41 and the front substrate 42 in the stage 10. The pressure hole 11 may be formed in one side of the chamber since it supplies the pressure fluid. In addition, the pressure hole 11 may be formed as a single hole or as multiple holes.

Figure 5:
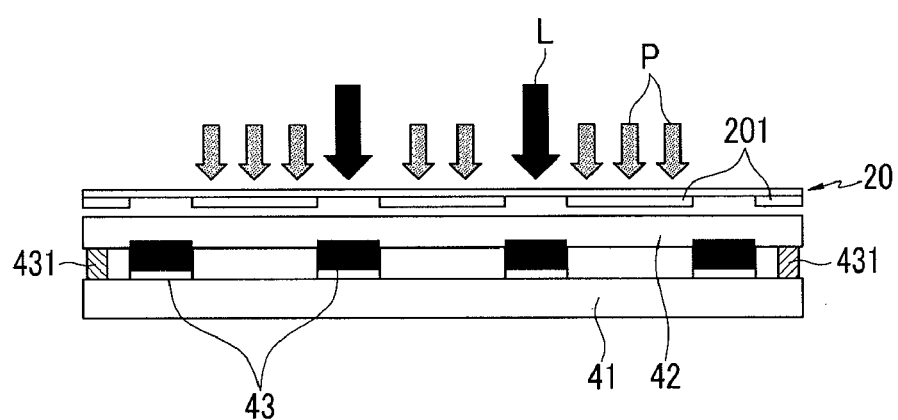
FIG. 5 shows a pressing and laser sealing state of the flat display panel sealing device of FIG. 1.

FIG. 5 shows a pressing and laser sealing state of the flat display panel sealing device of FIG. 1. Referring to FIG. 5, the pressure fluid supplied into the chamber 30 through the pressure hole 11 presses (P) the rear substrate 41 and the front substrate 42 loaded in the stage 10 in order to tightly bond the rear substrate 41 and the front substrate 42 to the cell sealant 43.

Referring to FIG. 2, a first control valve 111 is connected to the pressure hole 11. The first control value 111 controls the pressure of the pressure fluid so as to control the degree of bonding of the rear substrate 41 and the front substrate 42 to the cell sealant 43. For example, if the cell sealant 43 is on the rear substrate 41, the pressure fluid allows the front substrate 42 to bond to the cell sealant 43.

For efficient pressing operation, a first O-ring 51 is provided between the stage 10 and the chamber 30. In order to limit the location of the first O-ring 51, the stage 10 has a first O-ring groove 511. The first O-ring groove 511 is formed in a position that is outside of the facing area FA1 in the stage 10 and an edge of the pressure hole 11.

Therefore, when the stage 10 is lifted, the first O-ring 51 disposed in the first O-ring groove 511 is compressed against the chamber 30 and thus provides an airtight seal between the stage 10 and the chamber 30.

In addition, the stage 10 has a negative pressure hole 12 for applying negative pressure to suction the rear substrate 41. For example, in the embodiment of FIG. 1, the negative pressure hole 12 is formed in the facing area FA1 that faces the rear and front substrates 41 and 42 in the stage 10.

In addition, one or more negative pressure holes 12 may be formed in the facing area FA1 in the stage 10. When a plurality of negative pressure holes 12 are formed, the plurality of negative pressure holes 12 may be disposed in a lattice format within the facing area FA1 in the stage 10 so that uniform negative pressure can be applied to the entire area of the rear substrate 42 (see FIG. 1 and FIG. 2).

Referring to FIG. 2, the rear substrate 41 is held to the stage 10 by the negative pressure V applied to the rear substrate 41 through the negative pressure hole 12. A second control valve 121 is connected to the negative pressure hole 12. The second control valve 121 controls operation of the negative pressure V, and controls the degree of adherence of the rear substrate 41 and the front substrate 42 to the stage 10.

In some embodiments, a second O-ring 52 is provided between the stage 10 and the rear substrate 41 of the flat display panel. In order to limit the location of the second O-ring 52, the stage 10 has a second O-ring groove 521. The second O-ring groove 521 is formed in an area that is outside the negative pressure hole 12 on the stage 10.

Therefore, the second O-ring 52 disposed in the second O-ring groove 521 is compressed against the rear substrate 41 of the flat display panel to provide an airtight seal between the flat display panel and the stage 10.

The stage 10 is disposed at a lower portion of the chamber 30 and is lifted toward the chamber 30, and the mask 20 is disposed in an upper portion of the chamber 30.

The mask 20 is disposed facing the stage 10 in order to transmit a laser beam L radiated from a laser gun 61 to a cell sealant 43. The laser beam L is one example of light that heats the cell sealant 43, and various types of light can be applied in accordance with a material of the cell sealant 43.

The mask 20 is fixed by a holder 62 of the chamber 30 outside of the facing area FA1 that faces the flat display panel. That is, the mask 20 is mounted on the chamber 30 in a facing area FA2 that faces the chamber 30.

Referring to FIG. 5, the mask 20 exposes the cell sealant 43 to the laser beam, and includes a reflective layer 201 that is formed corresponding to areas other than the cell sealant 43 location. That is, the reflective layer 201 reflects the laser beam radiated to the areas other than the cell sealant 43 location in order to heat only the cell sealant 43 with the laser beam while preventing the areas other than the cell sealant 43 location from being heated by the laser beam.

In the mask 20 of the present exemplary embodiment, the reflective layer 201 is formed on the front substrate 42 side of mask 20. In some embodiments, the reflective layer 201 is formed on the laser L side of mask 20.

The mask 20 is provided in the chamber 30, the holder 62 is disposed at a circumference of the mask 20, and the holder 62 is fixed to the chamber 30 by using a combining member 63 such that the mask 20 is fixed to the chamber 30.

In order to prevent leakage of pressure fluid supplied to the pressure hole 11, a third O-ring 53 is provided between the mask 20 and the chamber 30. In order to limit a position of the third O-ring 53, the mask 20 has a third O-ring groove 531. The third O-ring groove 531 is formed in the facing portion FA2 that faces the chamber 30 in the mask 20.

The chamber 30, the mask 20, and the stage 10 collective form a pressure space.

Figure 6:
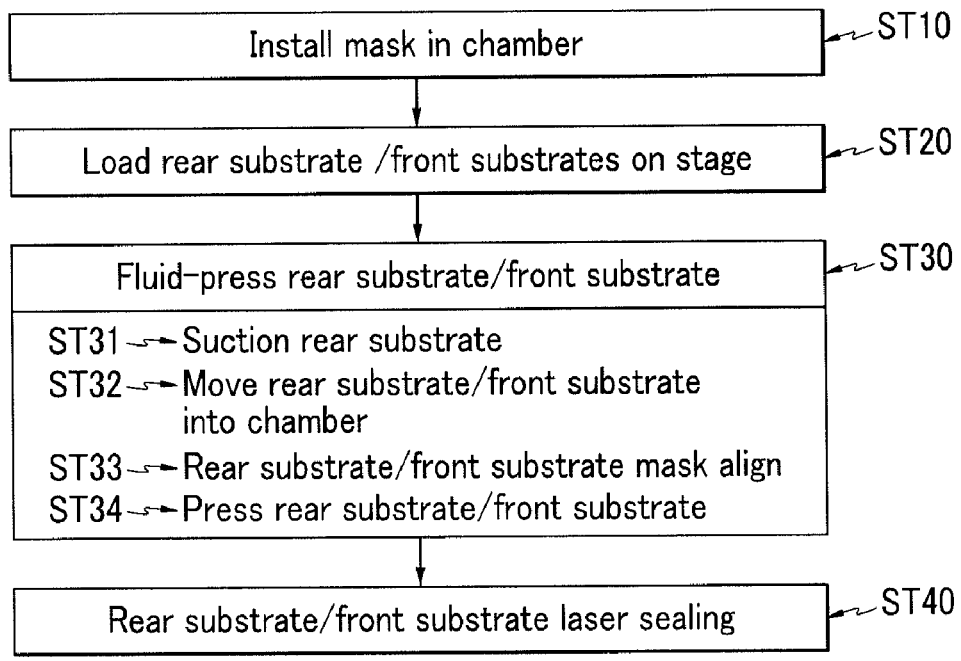
FIG. 6 is a flowchart of a flat display panel sealing method according to an exemplary embodiment.

FIG. 6 is a flowchart of a flat display panel sealing method according to an exemplary embodiment. The flat display panel sealing method will be described with reference to FIG. 2 and FIG. 6.

The flat panel display panel sealing method according to the exemplary embodiment includes a step ST10 of providing the mask 20 in the chamber 30 to face the stage 10, a step ST20 of loading the rear substrate 41 and the front substrate 42 in the stage 10, a step ST30 of pressing the rear substrate 41 and the front substrate 42 in the chamber 30, and a step ST40 of sealing by heating the cell sealant 43 with the laser beam L.

The mask providing step ST10 includes disposing the mask 20 in the facing area FA2 to face the stage 10, and fixing the holder 62 to the chamber 30 with the combining member 63.

The loading step ST20 includes loading the rear substrate 41 and the front substrate 42 to the stage 10. In some embodiments, the rear substrate 41 and the front substrate 42 are bonded by an edge sealant 431, and the cell sealant 43 that seals the flat display panels of unit cells is provided.

The pressing step ST30 provides pressure fluid into the chamber 30 through the pressure hole 11 of the stage 10 and presses (P) the rear substrate 41 and the front substrate 42. The pressure fluid is pressurized to a desired pressure greater than the internal pressure between the rear substrate 41 and the front substrate 42. In some embodiments, the pressure fluid is pressurized to a pressure greater than the pressure of the environment. In response, the rear substrate 41 and the front substrate 42 are attached to the cell sealant 43.

Compressed air or nitrogen may be used as the pressure fluid. Advantageously, the compressed air or the nitrogen does not generate scratches on surfaces of the rear substrate 41 and the front substrate 42.

The pressing step ST30 may further include a suctioning step ST31, which includes applying a negative pressure V to the rear substrate 41 through the negative pressure hole 12, to secure the rear substrate 41 to the stage 10.

The pressing step ST30 may include a moving step ST32, which includes moving the loaded rear and front substrates 41 and 42 in the chamber 30.

The pressing step ST30 may include an aligning step ST33, which includes aligning the moved rear and front substrates 41 and 42 with the mask 20. The pressing step ST30 may also include a pressurizing step ST34, which includes pressing the aligned rear and front substrates 41 and 42 by supplying pressure fluid and pressurizing the supplied pressure fluid to a particular pressure.

The sealing step ST40 includes heating the cell sealant 43 with laser beam L from the laser gun 61 to the mask 20 so as to seal the rear substrate 41 and the front substrate 42. The pressure fluid applies substantially uniform pressure to the rear substrate 41 and the front substrate 42 in all directions accessed by the pressure fluid. Therefore, the rear substrate 41 and the front substrate 42 are uniformly attached to the cell sealant 43.

Figure 7:
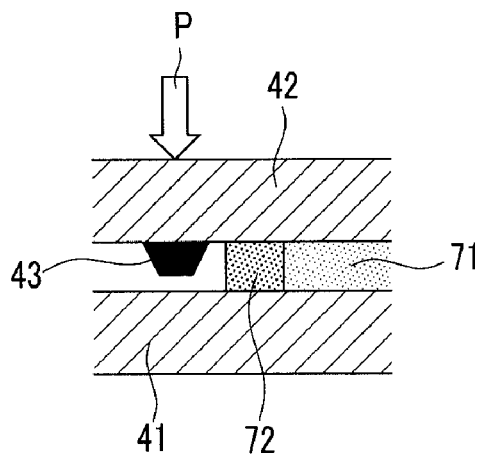
FIG. 7 shows a sealing state that corresponds to a separation failure of a glass frit during internal charging of the flat display panel of FIG. 1.

FIG. 7 shows a sealing state that corresponds to a separation failure of a glass frit during internal charging of the flat display panel of FIG. 1.

Referring to FIG. 7, when the rear substrate 41 and the front substrate 42 are internally charged, and, for example, a filling material 71 and a dam 72 are formed so that one of the substrates and the cell sealant 43 are separated, the flat display panel sealing method according to the present exemplary embodiment can be effectively applied.

That is, when the cell sealant 43 is heated with the laser beam L while the rear substrate 41 and the front substrate 42 are pressed by pressure P, the rear substrate 41 and the front substrate 42 can be firmly sealed.

While various aspects been described in connection with what is presently considered to be practical exemplary embodiments, it is to be understood that the invention is not limited to the disclosed embodiments, but, on the contrary, is intended to cover various modifications and equivalent arrangements.

What is claimed is:

1. A flat display panel sealing device comprising: a stage configured to support a first substrate and a second substrate that are to be bonded together by a sealant between the first and second substrates; a mask facing the stage and configured to transmit radiated light to the sealant; and a chamber configured to receive a pressure fluid to apply pressure to the first and second substrates, wherein the pressure fluid is pressurized to a pressure greater than a pressure external to the device.

2. The flat display panel sealing device of claim 1, comprising a pressure hole that supplies the pressure fluid into the chamber.

3. The flat display panel sealing device of claim 2, wherein the pressure hole is formed in at least one side of the stage outside an area that faces the first and second substrates and the chamber.

4. The flat display panel sealing device of claim 2, wherein the stage comprises a first O-ring groove for a first O-ring that seals the chamber.

5. The flat display panel sealing device of claim 2, comprising a first control valve that is connected to the pressure hole and controls supply of the pressure fluid.

6. The flat display panel sealing device of claim 1, wherein the chamber is between the mask and the stage.

7. The flat display panel sealing device of claim 1, wherein the stage comprises a negative pressure hole configured to form a negative pressure at the first substrate.

8. The flat display panel sealing device of claim 7, wherein the stage comprises a plurality of pressure holes.

9. The flat display panel sealing device of claim 8, wherein the plurality of negative pressure holes are arranged in a lattice format.

10. The flat display panel sealing device of claim 7, wherein the stage comprises a second O-ring groove for a second O-ring that seals the chamber between the first substrate and the stage.

11. The flat display panel sealing device of claim 7, comprising a second control valve that is connected to the negative pressure hole and is configured to control the negative pressure.

12. The flat display panel sealing device of claim 1, wherein the mask is fixed to the chamber by a holder, and the mask has a third O-ring groove for a third O-ring that seals the chamber between the mask and the holder.

13. The flat display panel sealing device of claim 1, wherein the mask exposes the cell sealant to the light, and further comprises a reflection film that is formed in an area corresponding to an area other than an area of the sealant.

14. The flat display panel sealing device of claim 1, wherein the flat display panel comprises an organic light emitting diode (OLED) display.

15. The flat display panel sealing device of claim 1, wherein the sealant comprises a glass frit.

16. The flat display panel sealing device of claim 1, wherein the light is formed by a laser beam.

* * * * *